(12) United States Patent
Shao et al.

(10) Patent No.: US 12,369,313 B2
(45) Date of Patent: Jul. 22, 2025

(54) SEMICONDUCTOR STRUCTURE AND METHOD FOR FABRICATING THE SAME

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/878,940

(22) Filed: Aug. 2, 2022

(65) Prior Publication Data
US 2025/0024659 A1 Jan. 16, 2025

Related U.S. Application Data

(63) Continuation of application No. PCT/CN2022/099974, filed on Jun. 20, 2022.

(30) Foreign Application Priority Data

Mar. 25, 2022 (CN) .......................... 202210303203.2

(51) Int. Cl.
*H10B 12/00* (2023.01)

(52) U.S. Cl.
CPC ......... *H10B 12/482* (2023.02); *H10B 12/036* (2023.02); *H10B 12/05* (2023.02); *H10B 12/33* (2023.02); *H10B 12/488* (2023.02)

(58) Field of Classification Search
CPC ........ H10B 12/30; H10B 12/03; H10B 12/05; H10B 12/0335; H10B 12/315; H10B 12/482; H10B 12/488
See application file for complete search history.

(56) References Cited

U.S. PATENT DOCUMENTS

| 2010/0097835 | A1 | 4/2010 | Popp et al. |
| 2016/0260729 | A1 | 9/2016 | Miyazaki |
| 2019/0013355 | A1 | 1/2019 | Tajima et al. |
| 2019/0103407 | A1* | 4/2019 | Kim ........................ H10B 12/30 |
| 2021/0202485 | A1 | 7/2021 | Inaba et al. |

FOREIGN PATENT DOCUMENTS

| EP | 0315803 A2 | 5/1989 |
| WO | 2013091374 A1 | 6/2013 |

* cited by examiner

*Primary Examiner* — Fernando L Toledo
*Assistant Examiner* — Adam S Bowen
(74) *Attorney, Agent, or Firm* — Kilpatrick Townsend & Stockton LLP

(57) ABSTRACT

Embodiments provide a semiconductor structure and a method for fabricating a semiconductor structure. The semiconductor structure includes a substrate, a capacitor structure, a transistor structure, bit lines, and word lines. The capacitor structure is arranged on the substrate, the transistor structure is arranged on a side of the capacitor structure, one of a source and a drain of the transistor structure is electrically connected to the capacitor structure, a gate of the transistor structure is electrically connected to the word lines, and other one of the source and the drain of the transistor structure is electrically connected to the bit lines. A word line isolation structure is arranged between adjacent two of the word lines, and a bit line isolation structure is arranged between adjacent two of the bit lines. A width of the word line isolation structure is not equal to a width of the bit line isolation structure.

20 Claims, 10 Drawing Sheets

SEMICONDUCTOR STRUCTURE AND METHOD FOR FABRICATING THE SAME

CROSS-REFERENCE TO RELATED APPLICATION

The present disclosure is a continuation of PCT/CN2022/099974, filed on Jun. 20, 2022, which claims priority to Chinese Patent Application No. 202210303203.2 titled "SEMICONDUCTOR STRUCTURE AND METHOD FOR FABRICATING THE SAME" and filed to the State Intellectual Property Office on Mar. 25, 2022, the entire contents of which are incorporated herein by reference.

TECHNICAL FIELD

The present disclosure relates to the field of semiconductor manufacturing technology, and more particularly, to a semiconductor structure and a method for fabricating a semiconductor structure.

BACKGROUND

As a semiconductor memory configured to randomly write and read data at high speed, Dynamic Random Access Memory (DRAM) is widely used in data memory devices or apparatuses.

A DRAM includes a plurality of repeated memory cells, and each of the plurality of memory cells includes a capacitor and a transistor. The transistor of the DRAM with a Transistor on Capacitor (TOC) structure is arranged above the capacitor, and the capacitor is in contact with a substrate. The DRAM further includes a plurality of word lines and a plurality of bit lines, and the plurality of word lines and the plurality of bit lines are arranged at intervals, and extension directions of the plurality of word lines and extension directions of the plurality of bit lines intersect with each other.

However, the DRAM with the above TOC structure has poor stability in fabrication procedures, which has a negative effect on storage performance of the semiconductor memory.

SUMMARY

In a first aspect, the present disclosure provides a semiconductor structure, including a substrate, a capacitor structure, a transistor structure, a plurality of bit lines, and a plurality of word lines. The capacitor structure is arranged on the substrate, and the transistor structure is arranged on a side of the capacitor structure away from the substrate, where one of a source and a drain of the transistor structure is electrically connected to the capacitor structure, a gate of the transistor structure is electrically connected to the word lines, and other one of the source and the drain of the transistor structure is electrically connected to the bit lines. A word line isolation structure is arranged between adjacent two of the word lines, and a bit line isolation structure is arranged between adjacent two of the bit lines, where a width of the word line isolation structure is not equal to that of the bit line isolation structure.

In a second aspect, the present disclosure provides a method for fabricating a semiconductor structure. The method includes: providing a substrate; forming a capacitor structure, the capacitor structure being positioned on the substrate; forming a transistor structure, the transistor structure being positioned on the capacitor structure, and one of a source and a drain of the transistor structure being electrically connected to the capacitor structure; and forming a plurality of word lines and a plurality of bit lines, the plurality of word lines being electrically connected to a gate of the transistor structure, and the plurality of bit lines being electrically connected to other one of the source and the drain of the transistor structure. A word line isolation structure is arranged between adjacent two of the plurality of word lines, and a bit line isolation structure is arranged between adjacent two of the plurality of bit lines, where a width of the word line isolation structure is not equal to that of the bit line isolation structure.

Configuration of the present disclosure and other inventive objectives and beneficial effects thereof will be more apparent and lucid based on description of some embodiments in conjunction with the accompanying drawings.

DETAILED DESCRIPTION

Figure 1:
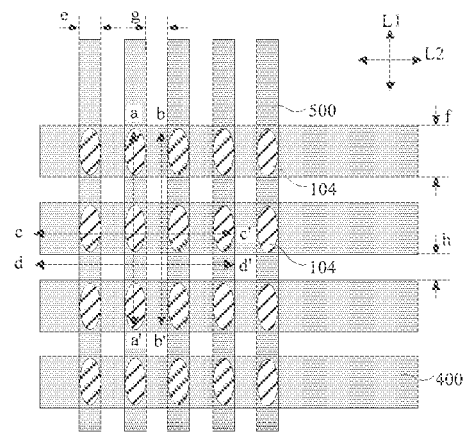
FIG. 1 is a top view of a semiconductor structure according to an embodiment of the present disclosure.

In an actual research process, it is found that a Dynamic Random Access Memory (DRAM) includes a plurality of repeated memory cells, and each of the plurality of memory cells includes a capacitor and a transistor. In the DRAM with a Transistor on Capacitor (TOC) structure, the transistor of is arranged above the capacitor, and the capacitor is in contact with a substrate. In fabrication procedures of the DRAM, it is required to etch in the substrate to form trenches in a word line direction and trenches in a bit line direction, and deposit material layers in the trenches to form a capacitor structure. However, when the trenches in the word line direction and the trench in the bit line direction are formed, the substrate reserved is prone to collapse due to poor support performance, which reduces stability of the DRAM and causes damage to storage performance of the DRAM.

In view of this, embodiments of the present disclosure provide a semiconductor structure and a method for fabricating a semiconductor structure. By arranging a capacitor structure on the substrate and arranging a transistor structure on a side of the capacitor structure away from the substrate, difficulty of fabrication procedures may be effectively reduced for the transistor, making it easier for connection between the transistor structure and the word lines and bit lines, to better meet design requirements of circuit connection. One of a source and a drain of the transistor is connected to the capacitor structure, a gate of the transistor is connected to the word line, and the other one of the source and the drain is connected to the bit line, to achieve signal storage and reading functions of the semiconductor structure. By arranging a word line isolation structure and a bit line isolation structure, stability of signal transmission over the word line and the bit line can be ensured. A width of the word line isolation structure is set not equal to that of the bit line isolation structure, which may improve stability of the semiconductor structure in the fabrication procedures and improve performance of the semiconductor structure.

Referring to FIGS. 1 to 4, embodiments of the present disclosure provide a semiconductor structure, which includes a substrate 100, a capacitor structure 200, a transistor structure 300, a plurality of bit lines 500, and a plurality of word lines 400. The capacitor structure 200 is arranged on the substrate 100, the transistor structure 300 is arranged on a side of the capacitor structure 200 away from the substrate 100, one of a source 301 and a drain 303 of the transistor structure 300 is electrically connected to the capacitor structure 200, a gate of the transistor structure 300 is electrically connected to each of the plurality of word lines 400, and other one of the source 301 and the drain 303 of the transistor structure 300 is electrically connected to each of the plurality of bit lines 500. A word line isolation structure 401 is provided between two adjacent word lines 400, and a bit line isolation structure 501 is provided between two adjacent bit lines 500. The width of the word line isolation structure 401 is not equal to the width of the bit line isolation structure 501.

It should be noted that the semiconductor structure provided by the embodiments of the present disclosure may be a memory device or a non-memory device. The memory device may include, for example, dynamic random access memory (DRAM), static random access memory (SRAM), flash memory, electrically erasable programmable read-only memory (EEPROM), phase change random access memory (PRAM) or magnetoresistive random access memory (MRAM). The non-memory device may be a logic device (e.g., microprocessors, digital signal processors, or microcontrollers) or the like. In the embodiments of the present disclosure, a DRAM memory is taken as an example for description.

In the embodiments of the present disclosure, the gate of the transistor structure 300 is connected to the word line (WL) 400, the drain 303 of the transistor structure 300 is connected to the bit line (BL) 500, and the source 301 of the transistor structure 300 is connected to the capacitor structure 200. The word line 400 is connected to a word line driver, and the word line driver inputs a voltage signal to the word line 400. The word line 400 may also be directly used as the gate of the transistor structure 300, and the voltage signal on the word line 400 can control on or off of the transistor structure 300, and then data information stored in the capacitor structure 200 is read through the bit line 500, or the data information is written into the capacitor structure 200 for storage through the bit line 500. In this way, the function of storing data information is implemented for the semiconductor structure.

Referring to FIG. 1, an embodiment of the present disclosure provides a plurality of word lines 400 and a plurality of bit lines 500. The plurality of bit lines 500 are arranged in parallel and extend in a first direction L1, and the plurality of bit lines 500 are arranged at intervals in a second direction L2. The plurality of word lines 400 are arranged in parallel and extend in the second direction L2, and the plurality of word lines 400 are arranged at intervals in the first direction L1. The first direction L1 and the second direction L2 intersect with each other. In this embodiment, an angle between the first direction L1 and the second direction L2 may be a right angle, and a value of this angle is not limited in this embodiment.

The word line isolation structure 401 between the adjacent word lines 400 may be made of insulating materials to avoid mutual interference of signals between two adjacent word lines 400, thereby improving the stability of signal transmission over the word lines 400. In addition, the word line isolation structure 401 may also provide support force to the word lines 400, to improve structural stability of the word lines 400. Similarly, the bit line isolation structure 501 also has a similar effect to the word line isolation structure 401, which is not to be repeated here. As shown in FIG. 1, the width of the word line isolation structure 401 may be shown by h, the width of the word line 400 may be shown by f: the width of the bit line isolation structure 501 may be shown by g, and the width of the bit line 500 may be shown by e.

In the embodiments of the present disclosure, the width of the word line isolation structure 401 is not equal to that of the bit line isolation structure 501, which may include two implementations as below. As shown in FIG. 1, as a first achievable implementation manner, the width of the word line isolation structure 401 is greater than that of the bit line isolation structure 501. Accordingly, the width of the word line 400 is greater than that of the bit line 500. In the fabrication procedures of the semiconductor structure, the word lines 400 and the bit lines 500 are respectively formed in different steps. For example, a trench extending in the first direction L1 and a trench extending in the second direction L2 are formed in the substrate 100 by means of etching, respectively. The bit lines 500 may be formed in the trench extending in the first direction L1, and the word lines 400 may be formed in the trench extending in the second direction L2. A support material 600 is deposited in the trenches extending in the above two directions, where the support material 600 can provide support to the substrate 100 reserved in the etching process. The width of the word line isolation structure 401 is greater than the width of the bit line isolation structure 501, and the width of the word lines 400 is greater than the width of the bit lines 500. Therefore, the support material 600 can fill the trench extending in the first direction L1, while exposing part of the trench extending in the second direction L2. The word lines 400 are formed by depositing a conductive material in the trench extending in the second direction L2. In the process of forming the word lines 400, the support material 600 in the trench extending in the first direction L1 can always support the substrate 100 reserved to prevent the substrate 100 from collapse or tilt, thus improving the structural stability of the semiconductor structure during the fabrication procedures.

The width of the word line 400 is greater than that of the bit line 500 by 1/3 to 3/2. When a ratio of difference between the width of the word line 400 and the width of the bit line 500 is greater, a larger difference exists between a signal transmission capacity of the word line 400 and that of the bit line 500, which has a negative effect on signal storage and reading processes of the semiconductor structure. Meanwhile, in the fabrication procedures, because the width of the bit line 500 is too small, it is more difficult to form the support material 600, and the bit line 500 may be deformed due to extrusion of the support material 600, which may reduce the stability of the semiconductor structure. When the ratio of the difference between the width of the word line 400 and the width of the bit line 500 is smaller, it is unable to guarantee that one of the trench extending in the first direction L1 and the trench extending in the second direction L2 is filled up with the support material 600 while the other one is not filled up when the support material 600 is formed, which may have a negative effect on formation of the word line 400 and the bit line 500. Therefore, the ratio of the difference between the width of the word line 400 and the width of the bit line 500 may be selected within the above range, including but not limited to 2/3 and 1/2, and a concrete value is not limited in this embodiment.

As a second achievable implementation manner, the width of the bit line isolation structure 501 is greater than that of the word line isolation structure 401, and correspondingly, the width of the bit line 500 is greater than that of the word line 400. Technical effects here are similar to those of the first implementation manner, and thus details thereof are not repeated here.

In some embodiments, the substrate 100 of the semiconductor structure of this embodiment may include semiconductor layers and a substrate isolation structure 102, where the substrate isolation structure 102 is positioned between the capacitor structure 200 and at least part of the semiconductor layers. A material of the semiconductor layer may include any one or more of Si, Ge, SiGe and SiC. In this embodiment, the substrate 100 is a Si substrate. The substrate isolation structure 102 is arranged between the capacitor structure 200 and at least part of the semiconductor layers, which can effectively prevent the semiconductor layers from having a negative effect on the capacitor structure 200, thereby preventing electrical coupling between the capacitor structure 200 and at least part of the semiconductor layers. In this way, the problem of electric leakage at a contact part between the capacitor structure 200 and the substrate 100 may be alleviated, the stability of the capacitor structure 200 may be improved, and thus the memory performance of the semiconductor structure may be optimized.

Figure 2:
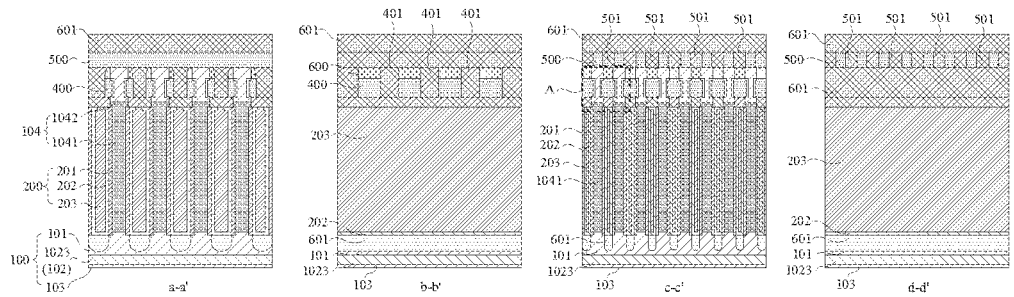
FIG. 2 is a cross-sectional view of a semiconductor structure according to an embodiment of the present disclosure.

In this embodiment of the present disclosure, the substrate isolation structure 102 may include two implementation manners as below. As a first achievable implementation manner, as shown in FIG. 2, the substrate 100 includes a first semiconductor layer 101 and a second semiconductor layer 103, where the first semiconductor layer 101 is stacked on the second semiconductor layer 103, and a substrate dielectric layer 1023 is arranged between the first semiconductor layer 101 and the second semiconductor layer 103 to form the substrate 100 having a silicon on insulator (SOI) structure. The capacitor structure 200 is in contact with the first semiconductor layer 101. The substrate dielectric layer 1023 forms the substrate isolation structure 102. The second semiconductor layer 103 may be provided with a signal wire of this semiconductor structure, while the first semiconductor layer 101 may not be provided with the signal wire, but is only used as a structural basis of the capacitor structure 200. Therefore, compared with the first semiconductor layer 101, the signal wire arranged in the second semiconductor layer 103 has a greater effect on the capacitor structure 200. On this basis, the substrate dielectric layer 1023 is positioned between the second semiconductor layer 103 and the capacitor structure 200, which can effectively prevent the electrical coupling between the capacitor structure 200 and the second semiconductor layer 103, prevent electric leakage of the capacitor structure 200, and improve the structural stability of the capacitor structure 200. The substrate dielectric layer 1023 may be an oxide layer, such as any one or more of $SiO_x$, $GeO_x$ and $SiGeO_x$. The substrate dielectric layer 1023 and the first semiconductor layer 101 may be formed on the second semiconductor layer 103 by means of deposition. Of course, the substrate dielectric layer 1023 may also be formed by oxidizing part of the second semiconductor layer 103. FIG. 2 includes cross-sectional views along four positions a-a', b-b', c-c' and d-d' in FIG. 1. The subsequent drawings are similar to this, and will not be repeated here.

Figure 3:
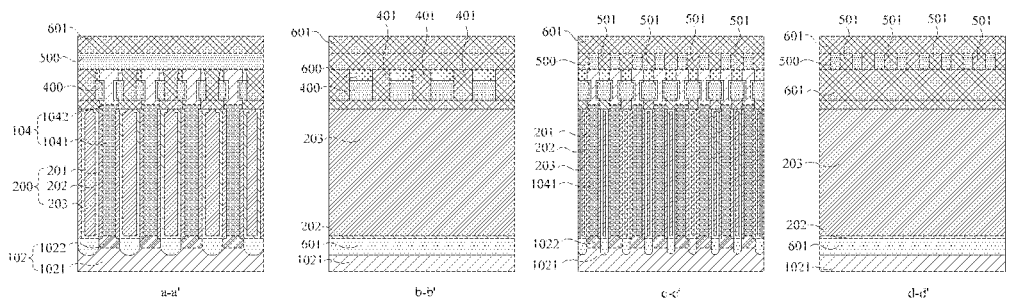
FIG. 3 is a cross-sectional view of another semiconductor structure according to an embodiment of the present disclosure.

As a second achievable implementation manner, as shown in FIG. 3, the substrate 100 includes a first semiconductor layer 101, where the substrate isolation structure 102 is arranged between the first semiconductor layer 101 and the capacitor structure 200, and the capacitor structure 200 is in contact to the substrate isolation structure 102. The substrate isolation structure 102 includes a first doped layer 1021 and a second doped layer 1022 stacked up, and a doping type of the first doped layer 1021 is different from that of the second doped layer 1022. The first doped layer 1021 and the second doped layer 1022 may be doped structures formed in the Si substrate, where the first doped layer 1021 may be a P-type doped layer, the second doped layer 1022 may be an N-type doped layer, an a PN junction may be formed between the first doped layer 1021 and the second doped layer 1022. When electrical coupling occurs between the substrate 100 and the capacitor structure 200, coupled current may be depleted at the PN junction, thereby achieving the effect of isolating the first doped layer 1021 and the second doped layer 1022, preventing electric leakage of the capacitor structure 200, and thus improving the structural stability of the capacitor structure 200. Of course, the first doped layer 1021 may be an N-type doped layer, and the second doped layer 1022 may be a P-type doped layer, which are not limited in this embodiment.

In some embodiments, the capacitor structure 200 includes a plurality of capacitors arranged in an array. The capacitor may include a first electrode, a capacitor dielectric layer 202 and a second electrode, where the capacitor dielectric layer 202 is positioned between the first electrode and the second electrode. The first electrode or the second electrode between two adjacent capacitors may be used as a common electrode, which can effectively reduce installation space occupied by the capacitor structure 200 and thus improve integration of the capacitor structure 200. As an achievable implementation manner, the materials of the first electrode and the second electrode include a combination of one or more of N—Si, P—Si, Ru, $RuO_2$, and TiN. The material of the capacitor dielectric layer 202 includes a combination of one or more of $Al_2O_3$, ZrO, $HfO_2$, $SrTiO_3$, and $BaTiO_3$. The capacitor dielectric layer 202 may be made of a material with a high dielectric constant, to reduce the electric leakage of the capacitor dielectric layer 202 and further ensure the stability of the capacitor structure 200. As shown in FIG. 2 and FIG. 3, the first conductive layer 201 may form the first electrode, and the second conductive layer 203 may form the second electrode.

The transistor structure 300 includes a plurality of transistors arranged in an array, and the plurality of transistors and the plurality of capacitors are arranged in one-to-one correspondence. The plurality of transistors and the plurality of capacitors are arranged in one-to-one correspondence, which may be understood as a fact that the first electrode of one capacitor is arranged in contact with the source 301 of one transistor in one-to-one correspondence, and the first electrode and the source 301 are electrically conductive to achieve the electrical connection between the transistor and the capacitor. In some embodiments, the second electrode of one capacitor may be in contact with the source 301 of one transistor, and the second electrode and the source 301 are electrically conductive.

Figure 4:
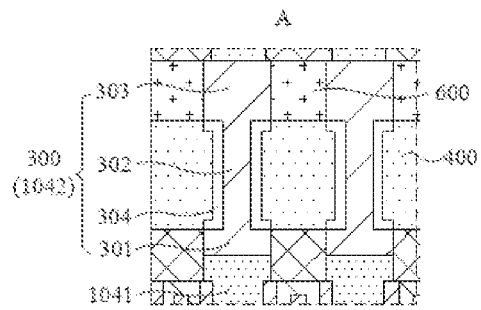
FIG. 4 is a schematic diagram showing a partial structure of Part A in FIG. 2.

Referring to FIGS. 2 to 4, the transistor includes a gate and a semiconductor pillar 104 extending in a vertical direction. Along a direction upward from the substrate 100, the semiconductor pillar 104 sequentially comprises a source 301, a trench 302 and a drain 303, where the gate is a ring structure and surrounds a periphery of the trench 302, and a gate dielectric layer 304 is arranged between the gate and the trench 302. The transistor in this embodiment is a vertical type transistor, which can effectively reduce the installation space occupied by the transistor structure 300 and thus effectively improve the integration of the transistor structure 300. In addition, the gate in the transistor structure 300 is a ring structure around a periphery of the trench 302, forming a gate-all-around (GAA) structure, which can effectively improve gate control capability of the transistor structure 300. The gate dielectric layer 304 may surround between the gate and the trench 302, thereby avoiding the electric leakage of the gate and improving the structural stability of the transistor. In some embodiments, in the semiconductor pillar 104 of the transistor, the drain 303 may be positioned below the source 301, the drain 303 is electrically connected to the first electrode of the capacitor structure 200, and the source 301 is electrically connected to the bit lines 500, which is not limited in this embodiment.

The word line 400 surrounds a periphery of the gate of the transistor structure 300, and the bit line 500 is arranged on a side of the transistor structure 300 away from the substrate 100. It should be noted that both the word line 400 and the bit line 500 may be made of metal materials, including but not limited to W and Cu, to reduce the resistance of the bit line 500 and the resistance of the word line 400. The word line 400 surrounds the periphery of the gate of the transistor structure 300, which can effectively reduce difficulty of connection between the word line 400 and the gate. The bit line 500 is arranged on the side of the transistor structure 300 away from the substrate 100, which may reduce difficulty of arrangement of the bit line 500, and facilitate the connection between the bit line 500 and an external bit line driver, such that a signal may be introduced from the bit line 500, to better meet design requirements of a circuit structure in the semiconductor structure.

Referring to FIG. 4, it should be noted that the semiconductor pillar 104 in this embodiment includes a first extension segment 1041 and a second extension segment 1042 connected to each other, where the first extension segment 1041 is positioned on a side of the second extension segment 1042 close to the substrate isolation structure 102, and the second extension segment 1042 may be configured to form the transistor. The first extension segment 1041 is positioned in the capacitor structure 200. The first extension segment 1041 may be made of a conductive material, and the first conductive layer 201 may be in contact with the first extension segment 1041 and is electrically conductive. The first extension segment 1041 is connected to the second extension segment 1042, such that the first extension segment 1041 is connected to the source 301 of the transistor. Therefore, in this embodiment, conduction between the source 301 of the transistor and the first conductive layer 201 is achieved by electrically conducting the first extension segment 1041 to the source 301 of the transistor and the first conductive layer 201, respectively. In some feasible embodiments, the first conductive layer 201 may not be arranged, and the conductive first extension segment 1041 may be used as the first electrode of the capacitor.

Figure 5:
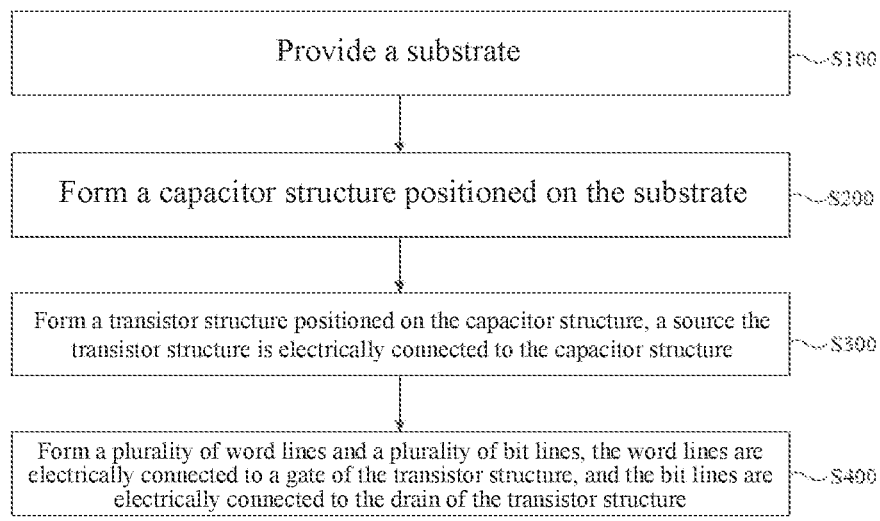
FIG. 5 is a schematic flow diagram of a method for fabricating a semiconductor structure according to an embodiment of the present disclosure.
Figure 6:
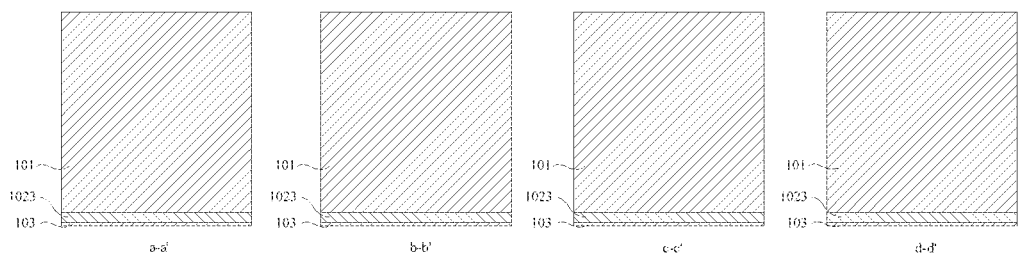
FIG. 6 is a cross-sectional view of a substrate provided for the semiconductor structure according to an embodiment of the present disclosure.

On the basis of the above-mentioned embodiments, with reference to FIG. 5, the present disclosure provides a method for fabricating a semiconductor structure, including:

S100: providing a substrate. Referring to FIG. 6, the providing the substrate 100 may include: forming a first semiconductor layer 101, where a plurality of semiconductor pillars 104 arranged in an array are formed in the first semiconductor layer 101, each of the plurality of semiconductor pillars 104 has different widths in a first direction L1 and a second direction L2, an insulating dielectric layer 601 is formed between adjacent two of the plurality of semiconductor pillars 104, and the first direction L1 and the second direction L2 intersect with each other.

Figure 7:
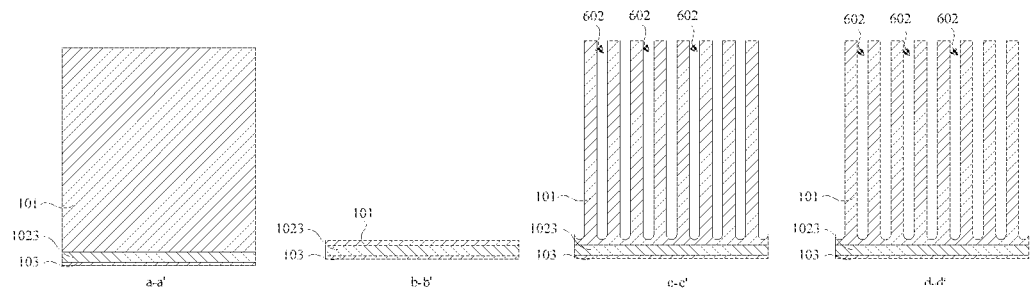
FIG. 7 is a cross-sectional view of the semiconductor structure with a first sub trenches formed according to an embodiment of the present disclosure.
Figure 8:
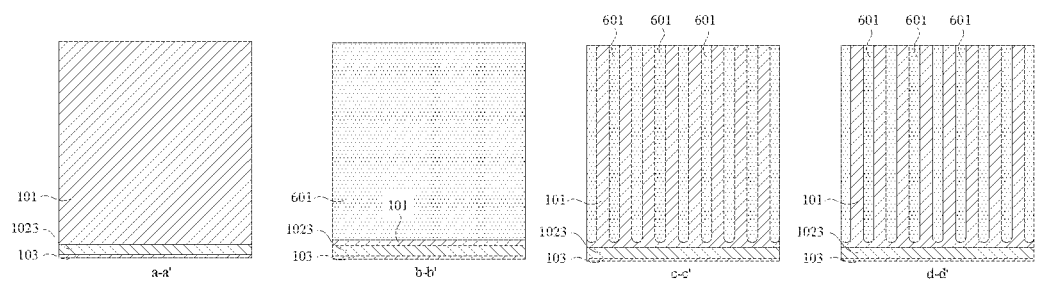
FIG. 8 is a cross-sectional view of the semiconductor structure with an insulating dielectric layer filled in the first sub trenches according to an embodiment of the present disclosure.
Figure 9:
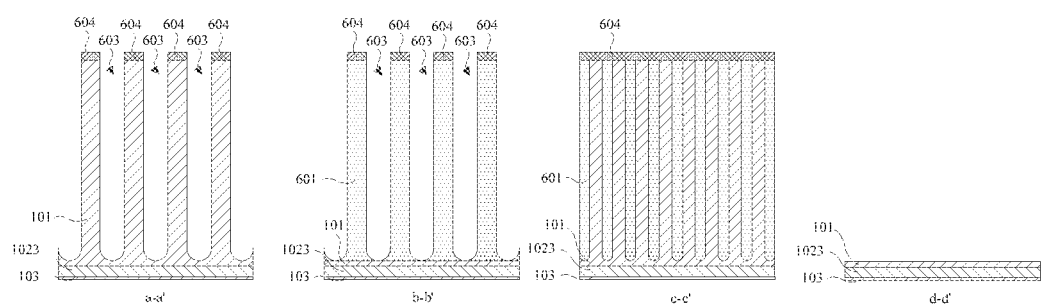
FIG. 9 is a cross-sectional view of the semiconductor structure with a second sub trenches formed according to an embodiment of the present disclosure.
Figure 10:
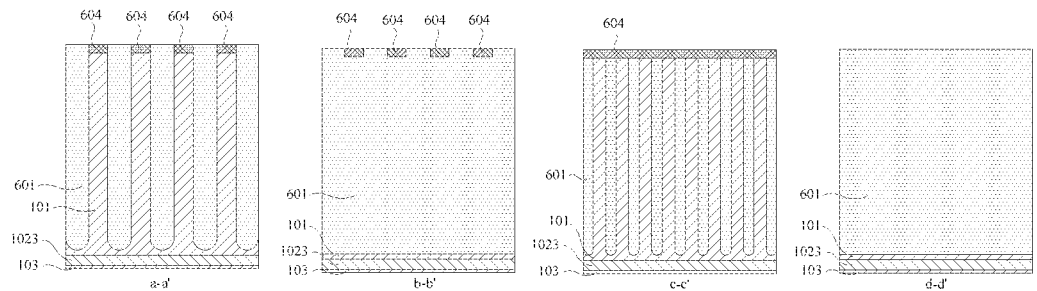
FIG. 10 is a cross-sectional view of the semiconductor structure with the insulating dielectric layer filled in the second sub trenches according to an embodiment of the present disclosure.

In some embodiments, the process of forming the semiconductor pillar 104 may include: forming the first semiconductor layer 101, whose structure is as shown in FIG. 6 and FIG. 7. A plurality of first sub trenches 602 extending in the first direction L1 are formed in the first semiconductor layer 101, where the plurality of first sub trenches 602 are arranged in parallel at intervals, and a structure of the first sub trench 602 is as shown in FIG. 7. An insulating dielectric layer 601 is formed, where the insulating dielectric layer 601 is positioned in the first sub trench 602. A top surface of the insulating dielectric layer 601 is flush with the top surface of the first semiconductor layer 101, and structures thereof are as shown in FIG. 8. A mask layer 604 is formed, and the mask layer 604 is positioned on the top surface of the first semiconductor layer 101 and the top surface of the insulating dielectric layer 601, where a material of the mask layer 604 may include, but is not limited to, boron nitride and silicon nitride. In addition, part of the first semiconductor layer 101 and part of the insulating dielectric layer 601 are removed along the mask layer 604 to form a plurality of second sub trenches 603 extending in the second direction L2, and the plurality of second sub trenches 603 are arranged in parallel at intervals, and structures of the second sub trenches 603 are as shown in FIG. 9. The insulating dielectric layer 601 is formed again, where the insulating dielectric layer 601 is positioned in the second sub trench 603. The top surface of the insulating dielectric layer 601 is flush with that of the first semiconductor layer 101, and structures thereof are as shown in FIG. 10. A material of the insulating dielectric layer 601 filled in the first sub trench 602 and the second sub trench 603 may be the same, where the material includes but is not limited to $SiO_2$.

An overlapping part between the first sub trench 602 and the second sub trench 603 forms a plurality of trenches arranged in an array, and the first semiconductor layer 101 positioned between two adjacent trenches forms a semiconductor pillar 104. In this embodiment, the width of the first sub trench 602 is smaller than that of the second sub trench 603. The width of the semiconductor pillar 104 in the first direction L1 is smaller than that of the semiconductor pillar 104 in the second direction L2. As shown in FIG. 1, the width of the semiconductor pillar 104 in the first direction L1 may be shown by e, and the width of the semiconductor pillar 104 in the second direction L2 may be shown by f. In some embodiments, the width of the first sub trench 602 may be greater than that of the second sub trenches 603, and the width of the semiconductor pillar 104 in the first direction L1 is greater than that of the semiconductor pillar 104 in the second direction L2. In this way, it is facilitated that the semiconductor pillar 104 is stably supported in subsequent processes of fabricating the capacitor structure 200, the transistor structure 300, the bit line 500 and the word line 400, thereby avoiding collapse or inclination of the semiconductor pillar 104, and thus improving the structural stability of the semiconductor pillar 104.

In some embodiments, in the semiconductor structure of this embodiment, a substrate isolation structure 102 is arranged between the capacitor structure 200 and at least part of the semiconductor layer of the substrate 100, where the substrate isolation structure 102 can effectively prevent the electric leakage at the contact between the capacitor structure 200 and the semiconductor layer of the substrate 100. As a first implementation manner, as shown in FIG. 6, before forming the first semiconductor layer 101, the method further includes: forming a second semiconductor layer 103, where the first semiconductor layer 101 is positioned on the second semiconductor. A substrate dielectric layer 1023 is formed, where the substrate dielectric layer 1023 is positioned between the first semiconductor layer 101 and the second semiconductor layer 103. The substrate dielectric layer 1023 forms the substrate isolation structure 102.

As a second implementation manner, the forming a first semiconductor layer 101 includes: forming a first doped layer 1021 and a second doped layer 1022 in the first semiconductor layer 101, where the second doped layer 1022 is positioned on the first doped layer 1021, a doping type of the first doped layer 1021 is different from a doping type of the second doped layer 1022, and the first doped layer 1021 and the second doped layer 1022 form the substrate isolation structure 102. The first doped layer 1021 may be a P-type doped layer, which may be a low-concentration P-type doped layer. The second doped layer 1022 may be an N-type doped layer, which may be a high-concentration N-type doped layer. A PN junction is formed between the first doped layer 1021 and the second doped layer 1022 to isolate the electric leakage between the capacitor structure 200 and the semiconductor layer of the substrate 100.

Figure 11:
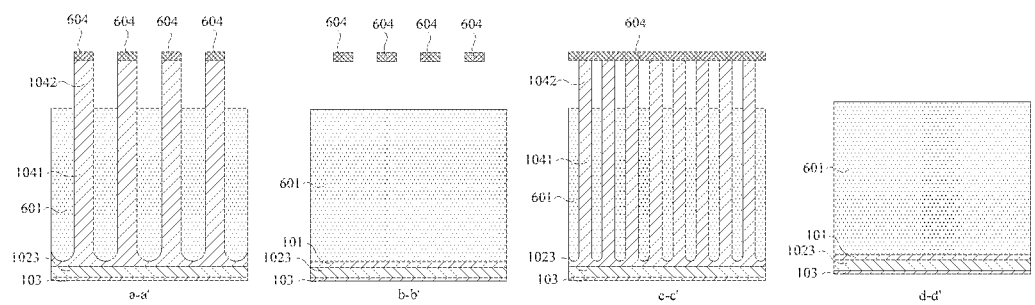
FIG. 11 is a cross-sectional view of the semiconductor structure with a second extension segment exposed according to an embodiment of the present disclosure.
Figure 12:
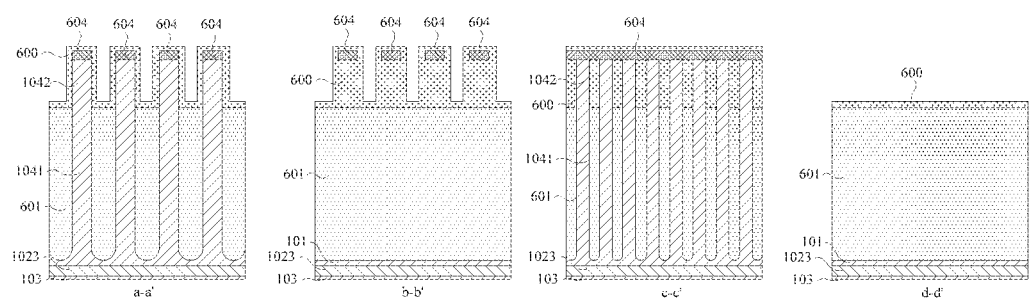
FIG. 12 is a cross-sectional view of the semiconductor structure with a support material formed for supporting the second extension segment according to an embodiment of the present disclosure.

After the substrate 100 is formed, the method further includes S200: forming a capacitor structure, where the capacitor structure is positioned on the substrate. It should be noted that, before forming the capacitor structure 200, the method further includes: etching and removing part of the insulating dielectric layer 601 to expose a part of the semiconductor pillar 104, where structures of thereof are shown in FIG. 11. The part of the semiconductor pillar 104 exposed in this step is the second extension segment 1042, while the mask layer 604 is reserved. A support material 600 is deposited to form a support layer. In the first direction L1, the support material 600 fills up a spacer region between adjacent bit lines 500, and in the second direction L2, the support material 600 does not fill up a spacer region between adjacent word lines 400, structures thereof being shown in FIG. 12. The support material 600 includes, but is not limited to, a material containing N or C. The spacer region between adjacent bit lines 500 is the first sub trench 602, and the region between adjacent word lines 400 is the second sub trench 603. Based on a fact that the width of the first sub trench 602 is smaller than that of the second sub trench 603 in this embodiment, the first sub trench 602 may be filled up with the support material 600 of the same thickness, without filling up the second sub trenches 603.

Figure 13:
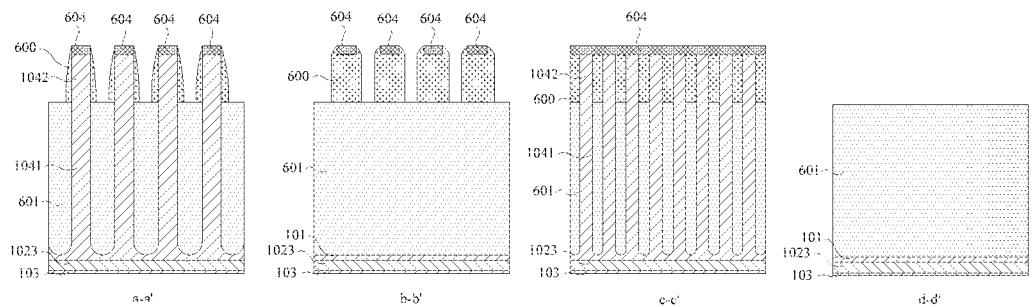
FIG. 13 is a cross-sectional view of the semiconductor structure with an exposed part of an insulating dielectric layer extending along a second direction according to an embodiment of the present disclosure.
Figure 14:
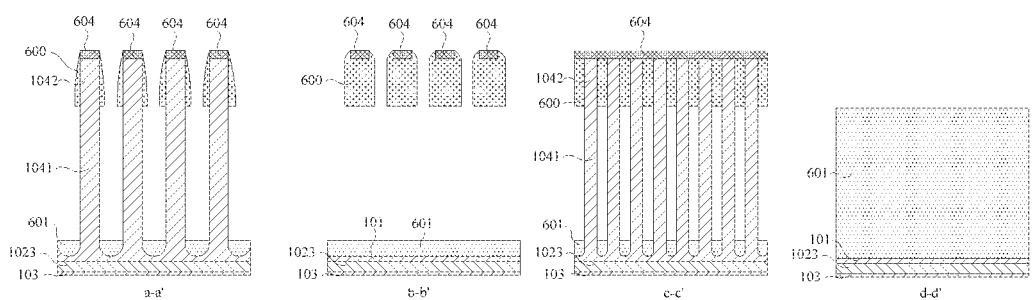
FIG. 14 is a cross-sectional view of the semiconductor structure with the insulating dielectric layer removed according to an embodiment of the present disclosure.

After the support material 600 is deposited, part of the support material 600 is removed by means of etching back to expose the top surface of the mask layer 604 and the top surface of the insulating dielectric layer 601 positioned in the second sub trench 603, structures thereof being shown in FIG. 13. Further, the insulating dielectric layer 601 is removed by means of etching back to expose the first extension segment 1041 of the semiconductor pillar 104, where structures thereof are shown in FIG. 14. The insulating dielectric layer 601 may oxidize Si of part of the first extension segment 1041 in the formation process, and the oxidized part of the first extension segment 1041 may be simultaneously removed in the process of removing the insulating dielectric layer 601. Therefore, the width of the first extension segment 1041 after this step is slightly smaller than the width of the second extension segment 1042, such that more space may be reserved for subsequent formation of the capacitor, thereby reducing difficulty of fabrication of the capacitor, and ensuring the structural stability of the capacitor.

Figure 15:
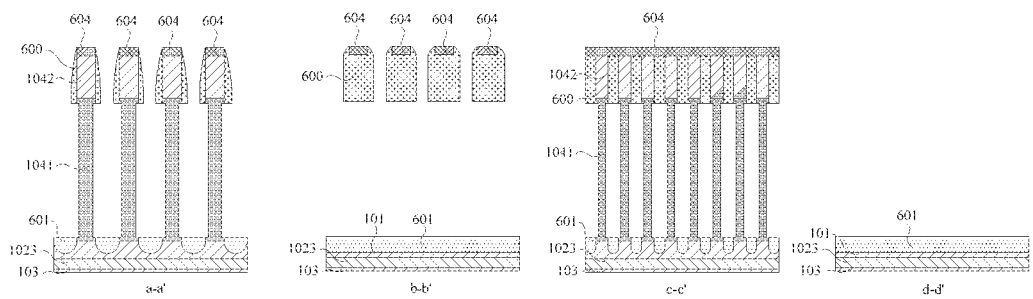
FIG. 15 is a cross-sectional view of the semiconductor structure with the first extension segment doped according to an embodiment of the present disclosure.
Figure 16:
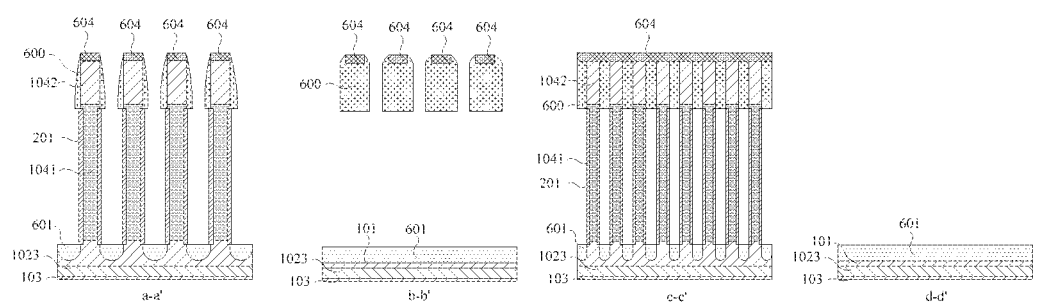
FIG. 16 is a cross-sectional view of the semiconductor structure with a first conductive layer formed according to an embodiment of the present disclosure.

After the first extension segment 1041 is exposed, the method also includes: doping the first extension segment 1041 to form the conductive first extension segment 1041, where structures thereof are shown in FIG. 15. It should be noted that in the doping process, doped ions may also penetrate into part of the second extension segment 1042 and part of the semiconductor layer in the substrate 100 due to diffusion. In this way, electrical conduction effects of the first extension segment 1041 and the second extension segment 1042 may be effectively improved. The conductive first extension segment 1041 may form the first electrode of the capacitor structure 200. In some embodiments, after the conductive first extension segment 1041 is formed, the method also includes: forming a first conductive layer 201, where the first conductive layer 201 is positioned in the trench, covers the conductive first extension segment 1041, and is electrically conducted to the first extension segment 1041, structures thereof being shown in FIG. 16. The first conductive layer 201 may also form the first electrode of the capacitor structure 200, thus forming the first electrode of a conductive on conductive (COC) structure.

Figure 17:
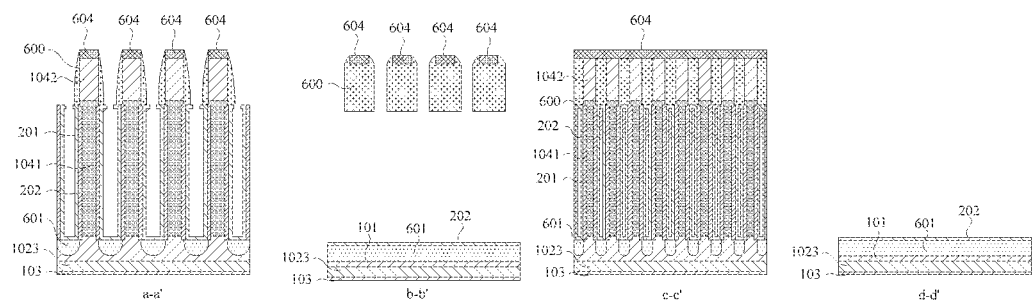
FIG. 17 is a cross-sectional view of the semiconductor structure with a capacitor dielectric layer formed according to an embodiment of the present disclosure.
Figure 18:
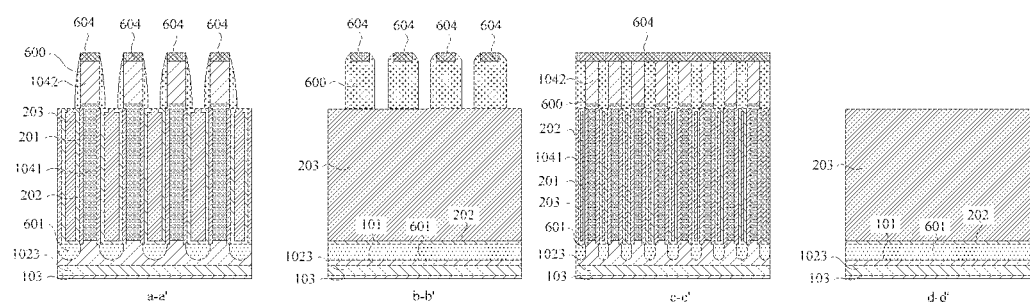
FIG. 18 is a cross-sectional view of the semiconductor structure with a second conductive layer formed according to an embodiment of the present disclosure.

After the first electrode of the capacitor structure 200 is formed, the method also includes: forming a capacitor dielectric layer 202, where the capacitor dielectric layer 202 is positioned in the trench and covers a sidewall of the first conductive layer 201, structures thereof being shown in FIG. 17. The capacitor dielectric layer 202 may be made of the above-mentioned material with a high dielectric constant, which will not be repeated here. After the capacitor dielectric layer 202 is formed, the method also includes: forming a second conductive layer 203, where the second conductive layer 203 is positioned in the trench and covers a sidewall of the capacitor dielectric layer 202, and the second conductive layer 203 forms the second electrode of the capacitor structure 200, structures thereof being shown in FIG. 18.

With reference to FIG. 5, after forming the capacitor structure 200, the method also includes S300: forming a transistor structure, where the transistor structure is positioned on the capacitor structure, and the source of the transistor structure is electrically connected to the capacitor structure.

Figure 19:
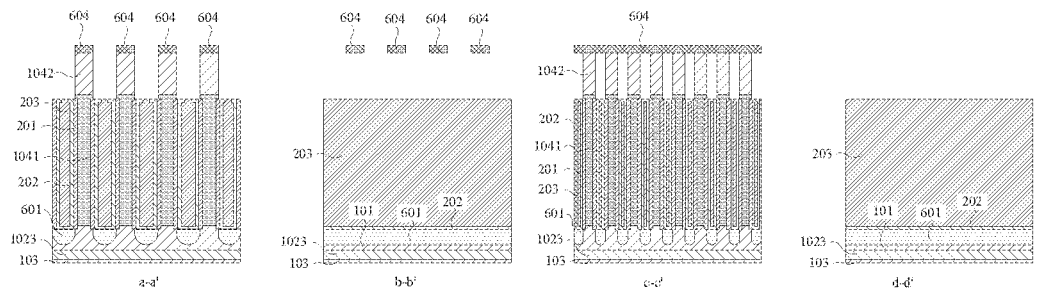
FIG. 19 is a cross-sectional view of the semiconductor structure with the support material removed from a periphery of the first extension segment according to an embodiment of the present disclosure.
Figure 20:
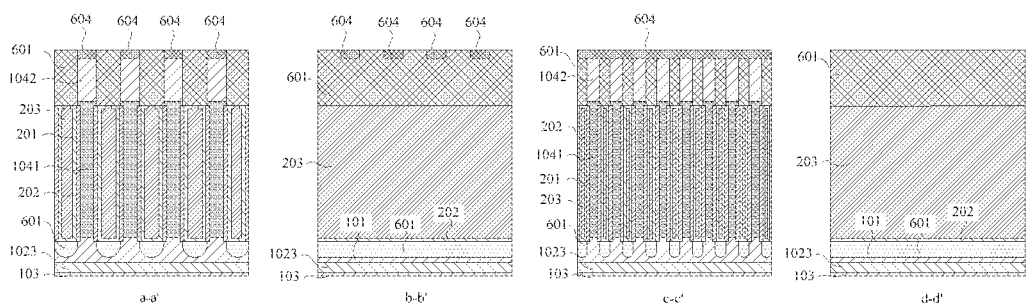
FIG. 20 is a cross-sectional view of the semiconductor structure with an insulating dielectric layer formed according to an embodiment of the present disclosure.
Figure 21:
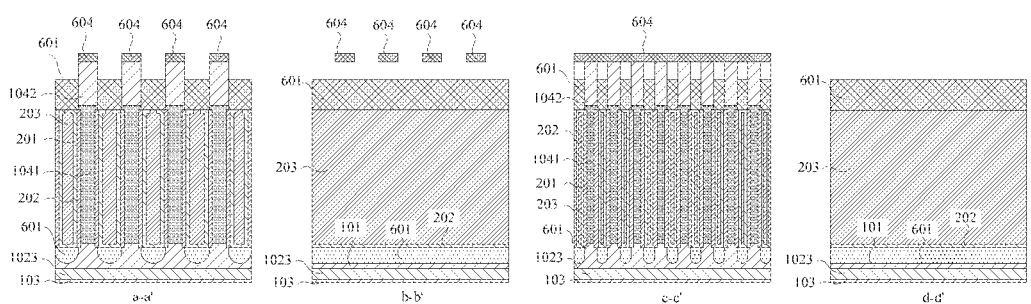
FIG. 21 is a cross-sectional view of the semiconductor structure with a part of the insulating dielectric layer removed according to an embodiment of the present disclosure.
Figure 22:
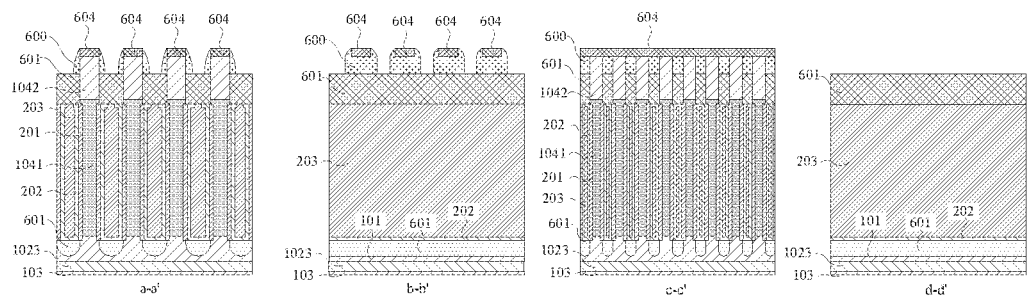
FIG. 22 is a cross-sectional view of the semiconductor structure with a support material formed for supporting the second extension segment according to an embodiment of the present disclosure.
Figure 23:
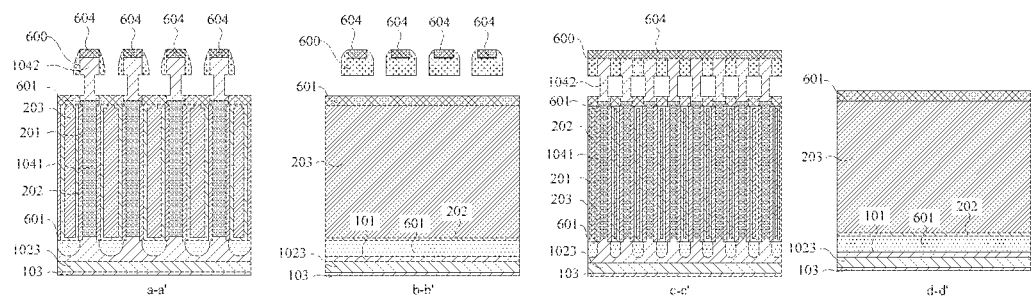
FIG. 23 is a cross-sectional view of the semiconductor structure with part of the second extension segment removed according to an embodiment of the present disclosure.
Figure 24:
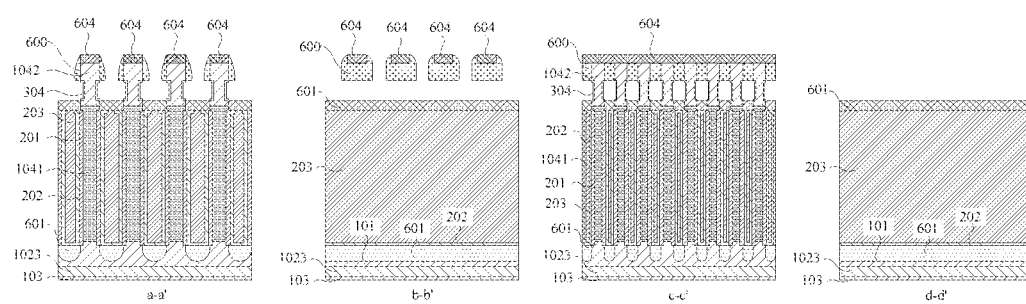
FIG. 24 is a cross-sectional view of the semiconductor structure with a gate dielectric layer formed according to an embodiment of the present disclosure.

In some embodiments, the support material 600 supporting the second extension segment 1042 is removed to expose the second extension segment 1042 and the mask layer 604, structures thereof being shown in FIG. 19. An insulating dielectric layer 601 is formed. The insulating dielectric layer 601 is positioned in the trench and covers the top surface of the capacitor structure 200 and the sidewall of the second extension segment 1042, where the top surface of the insulating dielectric layer 601 may be flush with the top surface of the mask layer 604, structures thereof being shown in FIG. 20. Part of the insulating dielectric layer 601 is removed by means of etching back to expose part of the second extension segment 1042, structures thereof being shown in FIG. 21. Next, the support material 600 is formed in the trench again, where the support material 600 in this step still fills up the first sub trench 602, but does not fill up the second sub trench 603. The support layer formed by the support material 600 can provide support force to the exposed second extension segment 1042, thereby ensuring the structural stability of the semiconductor pillar 104 in the process of fabricating the transistor structure 300, structures thereof being shown in FIG. 22. Part of the insulating dielectric layer 601 is removed by etching along the support material 600 to expose part of the second extension segment 1042 close to the first extension segment 1041, structures thereof being shown in FIG. 23. In this step, part of the second extension segment 1042 is oxidized in the process of forming the insulating dielectric layer 601. Therefore, in the process of removing the insulating dielectric layer 601, the oxidized second extension segment 1042 is removed simultaneously, such that the width of the part of the second extension segment 1042 close to the first extension segment 1041 is smaller than that of rest part of the second extension segment 1042. The second extension segment 1042 with a smaller width may form the trench 302 of the transistor. In this way, a space may be provided to the gate dielectric layer 304 of a subsequent transistor, such that difficulty of fabricating the transistor may be reduced. Along a direction upward from the substrate 100, the second extension segment 1042 sequentially forms the source 301, the trench 302 and the drain 303 of the transistor. After this step, a gate dielectric layer 304 is formed, where the gate dielectric layer 304 surrounds the periphery of the trench 302, structures thereof being shown in FIG. 24. A gate is formed, and the gate surrounds the periphery of the gate dielectric layer 304.

Figure 25:
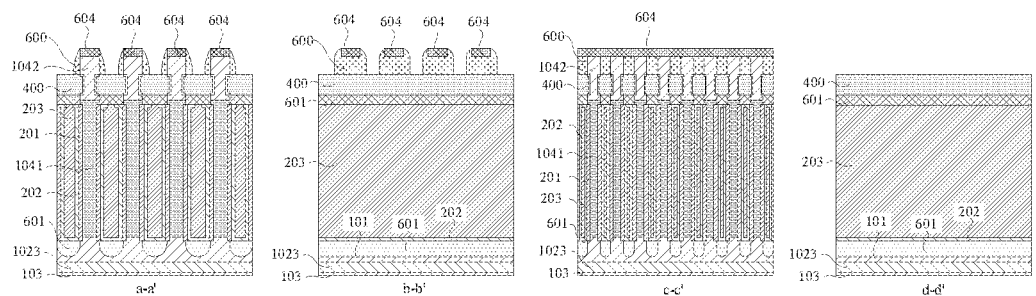
FIG. 25 is a cross-sectional view of the semiconductor structure with a word line formed according to an embodiment of the present disclosure.
Figure 26:
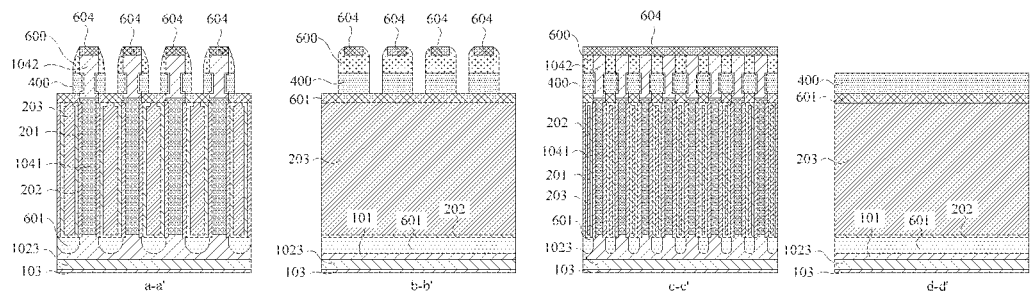
FIG. 26 is a cross-sectional view of the semiconductor structure with a word line isolation trench formed according to an embodiment of the present disclosure.
Figure 27:
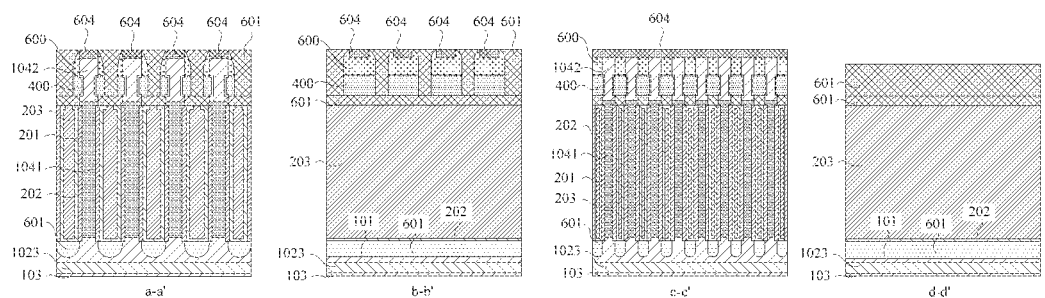
FIG. 27 is a cross-sectional view of the semiconductor structure with the insulating dielectric layer formed in the word line isolation trench according to an embodiment of the present disclosure.
Figure 28:
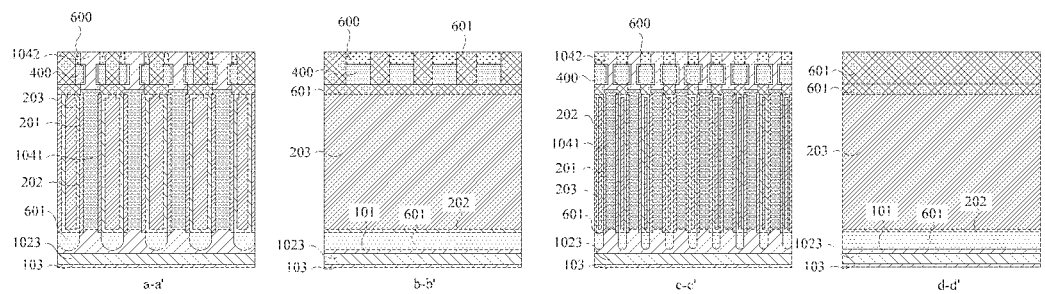
FIG. 28 is a cross-sectional view of the semiconductor structure with a mask layer removed according to an embodiment of the present disclosure.
Figure 29:
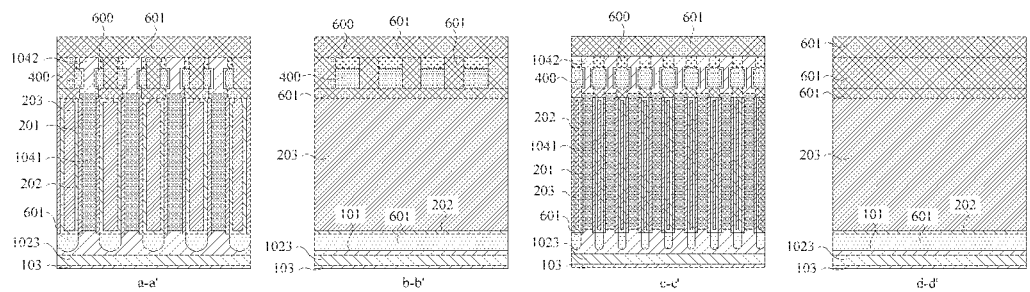
FIG. 29 is a cross-sectional view of the semiconductor structure with an insulating dielectric layer formed according to an embodiment of the present disclosure.
Figure 30:
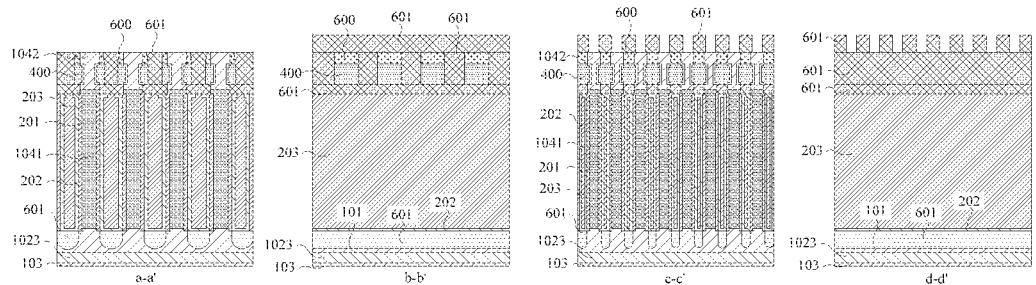
FIG. 30 is a cross-sectional view of the semiconductor structure with a bit line trench formed according to an embodiment of the present disclosure.
Figure 31:
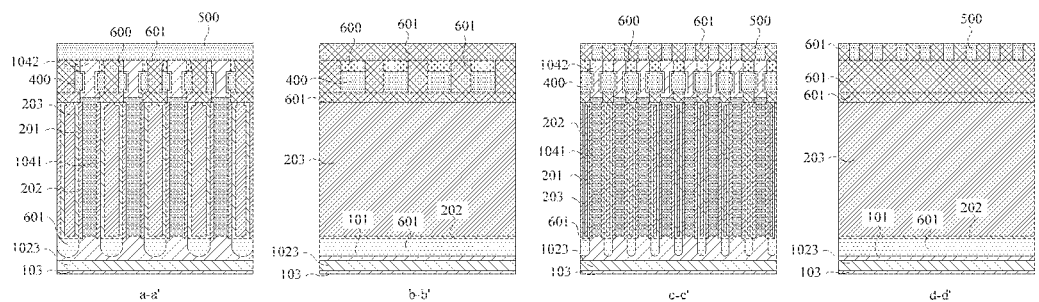
FIG. 31 is a cross-sectional view of the semiconductor structure with a bit line formed according to an embodiment of the present disclosure.

With reference to FIG. 5, after the transistor structure 300 is formed, the method further includes S400: forming a plurality of word lines and a plurality of bit lines, where the word lines are electrically connected to the gate of the transistor structure, and the bit lines are electrically connected to the drain of the transistor structure. In some embodiments, a third conductive layer is formed, where the third conductive layer surrounds the periphery of the gate and is electrically connected to the gate, structures thereof being shown in FIG. 25. Part of the third conductive layers are removed by etching along the insulating dielectric layer 601, and the third conductive layers extending in the second direction L2 in parallel to each other are reserved, where the reserved third conductive layers form the word lines 400, structures thereof being shown in FIG. In this step, the third conductive layers are etched by means of the support material 600, such that the word lines 400 may be formed by means of self-aligned etching, thus reducing the difficulty of fabricating the word lines 400. The insulating dielectric layer 601 is formed again, where the insulating dielectric layer 601 is filled in the trench, and the top surface of the insulating dielectric layer 601 in this step may be flush with the top surface of the mask layer 604, structures thereof being shown in FIG. 27. The insulating dielectric layer 601 between two adjacent word lines 400 forms a word line isolation structure 401. Next, the mask layer 604, part of the insulating dielectric layer 601 and part of the support layer are removed by means of chemical mechanical polishing (CMP), and the top surface of the reserved support layer and the top surface of the insulating dielectric layer 601 are flush with the top surface of the second semiconductor, structures thereof being shown in FIG. 28. Next, the insulating dielectric layer 601 is formed again, structures thereof being shown in FIG. 29. A plurality of bit line trenches are formed in the insulating dielectric layer 601, where the plurality of bit line trenches extend in the first direction L1 and are parallel to each other, and the insulating dielectric layer 601 between adjacent bit line trenches forms a bit line isolation structure 501, structures thereof being shown in FIG. 30. A fourth conductive layer is formed, where the fourth conductive layer is positioned in the bit line trench, the top surface of the fourth conductive layer is flush with the top surface of the insulating dielectric layer 601, and the fourth conductive layer forms the bit line 500, structures thereof being shown in FIG. 31. After the bit line 500 is formed, the insulating dielectric layer 601 may be formed again to ensure the structural stability of the bit line 500, structures thereof being shown in FIG. 2 and FIG. 3.

The width of the word line isolation structure 401 is not equal to that of the bit line isolation structure 501. In this embodiment, the width of the first sub trench 602 is smaller than that of the second sub trench 603, and the width of the formed word line isolation structure 401 is greater than that of the bit line isolation structure 501. In this way, the structural stability of the semiconductor pillar 104 may be ensured in the fabrication procedures, and thus the stability of the semiconductor structure may be improved.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A semiconductor structure, comprising a substrate, a capacitor structure, a transistor structure, a plurality of bit lines and a plurality of word lines; wherein the capacitor structure is arranged on the substrate, the transistor structure is arranged on a side of the capacitor structure away from the substrate, one of a source and a drain of the transistor structure is electrically connected to the capacitor structure, a gate of the transistor structure is electrically connected to each of the plurality of word lines, and other one of the source and the drain of the transistor structure is electrically connected to each of the plurality of bit lines;
a word line isolation structure is arranged between adjacent two of the plurality of word lines, and a bit line isolation structure is arranged between adjacent two of the plurality of bit lines; and
a width of the word line isolation structure is greater than a width of the bit line isolation structure, or the width of the bit line isolation structure is greater than the width of the word line isolation structure.

2. The semiconductor structure according to claim 1, wherein a width of each of the plurality of word lines is greater than a width of each of the plurality of bit lines in a case where the width of the word line isolation structure is greater than the width of the bit line isolation structure.

3. The semiconductor structure according to claim 2, wherein the width of each of the plurality of word lines is greater than the width of each of the plurality of bit lines by 1/3 to 3/2 in the case where the width of the word line isolation structure is greater than the width of the bit line isolation structure.

4. The semiconductor structure according to claim 1, wherein a width of each of the plurality of bit lines is greater than a width of each of the plurality of word lines in a case where the width of the bit line isolation structure is greater than the width of the word line isolation structure.

5. The semiconductor structure according to claim 1, wherein the substrate comprises a semiconductor layer and a substrate isolation structure, and the substrate isolation structure is positioned between the capacitor structure and at least part of the semiconductor layer.

6. The semiconductor structure of claim 5, wherein the substrate comprises a first semiconductor layer, a substrate isolation structure is arranged between the first semiconductor layer and the capacitor structure, and the capacitor structure is in contact with the substrate isolation structure; and
the substrate isolation structure comprises a first doped layer and a second doped layer stacked up, and a doping type of the first doped layer is different from a doping type of the second doped layer.

7. The semiconductor structure according to claim 5, wherein the substrate comprises a first semiconductor layer and a second semiconductor layer, the first semiconductor layer is stacked on the second semiconductor layer, a substrate dielectric layer is arranged between the first semiconductor layer and the second semiconductor layer, and the capacitor structure is in contact with the first semiconductor layer; and
the substrate dielectric layer forms the substrate isolation structure.

8. The semiconductor structure according to claim 1, wherein the capacitor structure comprises a plurality of capacitors arranged in an array.

9. The semiconductor structure according to claim 8, wherein the transistor structure comprises a plurality of transistors arranged in an array, the plurality of transistors and the plurality of capacitors being arranged in one-to-one correspondence.

10. The semiconductor structure according to claim 9, wherein each of the plurality of transistors comprises a gate and a semiconductor pillar extending in a vertical direction; the semiconductor pillar sequentially comprising a source, a channel and a drain along a direction upward from the substrate; the gate being a ring structure and surrounding a periphery of the channel; and
a gate dielectric layer is arranged between the gate and a trench.

11. The semiconductor structure according to claim 1, wherein the plurality of word lines surround a periphery of the gate of the transistor structure, and the plurality of bit lines are arranged on a side of the transistor structure away from the substrate.

12. The semiconductor structure according to claim 1, wherein the plurality of bit lines extend in a first direction, the plurality of word lines extend in a second direction, and the first direction and the second direction intersect with each other.

13. A method for fabricating a semiconductor structure, comprising:
   providing a substrate;
   forming a capacitor structure, the capacitor structure being positioned on the substrate;
   forming a transistor structure, the transistor structure being positioned on the capacitor structure, and one of a source and a drain of the transistor structure being electrically connected to the capacitor structure; and
   forming a plurality of word lines and a plurality of bit lines, the plurality of word lines being electrically connected to a gate of the transistor structure, and the plurality of bit lines being electrically connected to other one of the source and the drain of the transistor structure;
   wherein a word line isolation structure is arranged between adjacent two of the plurality of word lines, a bit line isolation structure is arranged between adjacent two of the plurality of bit lines, and a width of the word line isolation structure is greater than a width of the bit line isolation structure, or the width of the bit line isolation structure is greater than the width of the word line isolation structure.

14. The method for fabricating a semiconductor structure according to claim 13, wherein the providing the substrate comprises:
   forming a first semiconductor layer, a plurality of semiconductor pillars arranged in an array being formed in the first semiconductor layer, each of the plurality of semiconductor pillars having different widths in a first direction and a second direction, an insulating dielectric layer being formed between adjacent two of the plurality of semiconductor pillars, and the first direction and the second direction intersecting with each other.

15. The method for fabricating a semiconductor structure according to claim 14, wherein a width of each of the plurality of semiconductor pillars in the first direction is smaller than a width of each of the plurality of semiconductor pillars in the second direction.

16. A method for fabricating a semiconductor structure, comprising:
   providing a substrate;
   forming a capacitor structure, the capacitor structure being positioned on the substrate;
   forming a transistor structure, the transistor structure being positioned on the capacitor structure, and one of a source and a drain of the transistor structure being electrically connected to the capacitor structure; and
   forming a plurality of word lines and a plurality of bit lines, the plurality of word lines being electrically connected to a gate of the transistor structure, and the plurality of bit lines being electrically connected to other one of the source and the drain of the transistor structure;
   wherein a word line isolation structure is arranged between adjacent two of the plurality of word lines, a bit line isolation structure is arranged between adjacent two of the plurality of bit lines, and a width of the word line isolation structure is not equal to a width of the bit line isolation structure;
   wherein the providing the substrate comprises:
   forming a first semiconductor layer, a plurality of semiconductor pillars arranged in an array being formed in the first semiconductor layer, each of the plurality of semiconductor pillars having different widths in a first direction and a second direction, an insulating dielectric layer being formed between adjacent two of the plurality of semiconductor pillars, and the first direction and the second direction intersecting with each other.

17. The method for fabricating a semiconductor structure according to claim 16, wherein a width of each of the plurality of semiconductor pillars in the first direction is smaller than a width of each of the plurality of semiconductor pillars in the second direction.

18. The method for fabricating a semiconductor structure according to claim 16, wherein the forming the first semiconductor layer comprises: forming a first doped layer and a second doped layer in the first semiconductor layer, the second doped layer being positioned on the first doped layer, the first doped layer and the second doped layer having different doping types, and the first doped layer and the second doped layer forming a substrate isolation structure.

19. The method for fabricating a semiconductor structure according to claim 16, wherein before forming the first semiconductor layer, the method further comprises:
   forming a second semiconductor layer, the first semiconductor layer being positioned on the second semiconductor;
   forming a substrate dielectric layer, the substrate dielectric layer being positioned between the first semiconductor layer and the second semiconductor layer; and
   the substrate layer forms the substrate isolation structure.

20. The method for fabricating a semiconductor structure according to claim 16, wherein before forming the capacitor structure, the method further comprises:
   removing part of the insulating dielectric layer by etching to expose a part of the plurality of semiconductor pillars; and
   depositing a support material to form a support layer, the support material filling up a spacer region between adjacent two of the plurality of bit lines in the first direction, and the support material not filling up a spacer region between adjacent two of the plurality of word lines in the second direction.

* * * * *